United States Patent [19]
Motohara

[11] Patent Number: 5,729,553
[45] Date of Patent: Mar. 17, 1998

[54] SEMICONDUCTOR INTEGRATED CIRCUIT WITH A TESTABLE BLOCK

[75] Inventor: Akira Motohara, Hyogo, Japan

[73] Assignee: Matsushita Electric Industrial Co., Ltd., Osaka, Japan

[21] Appl. No.: 684,066

[22] Filed: Jul. 19, 1996

Related U.S. Application Data

[62] Division of Ser. No. 518,961, Aug. 24, 1995.

[30] Foreign Application Priority Data

Aug. 29, 1994 [JP] Japan .................................. 6-203842

[51] Int. Cl.$^6$ .................................................. G01R 31/28
[52] U.S. Cl. .................................... 371/22.5; 371/22.3
[58] Field of Search ................................ 371/22.3, 22.5, 371/22.6, 22.1, 25.1, 67.1; 395/183.06

[56] References Cited

U.S. PATENT DOCUMENTS

| | | | |
|---|---|---|---|
| 3,806,891 | 4/1974 | Eichelberger et al. | 340/172.5 |
| 4,779,273 | 10/1988 | Beucler et al. | 371/25 |
| 5,043,985 | 8/1991 | Lin et al. | 371/22.5 |
| 5,392,296 | 2/1995 | Suzuki | 371/22.1 |
| 5,392,298 | 2/1995 | Shinjo | 371/25.1 |
| 5,406,567 | 4/1995 | Ogawa | 371/22.5 |
| 5,504,756 | 4/1996 | Kim et al. | 371/22.3 |

FOREIGN PATENT DOCUMENTS

| | | |
|---|---|---|
| 0 188 076 | 7/1986 | European Pat. Off. . |
| 90 05 697.3 | 8/1990 | Germany . |

OTHER PUBLICATIONS

Beausang et al., "Incorporation of the BILBO Technique Within an Existing Chip Design", IEEE 1985 Custom Integrated Circuits Conference Proceedings, pp. 328-331.

Primary Examiner—Robert W. Beausoliel, Jr.
Assistant Examiner—Trinh L. Tu
Attorney, Agent, or Firm—McDermott, Will & Emery

[57] ABSTRACT

Three blocks cascaded to one another in an LSI, namely, an input module, a macro module and an output module, are independently tested. A first test circuit is formed with a first multiplexer interposed between the macro module and the output module, and a second multiplexer and a first control register interposed between the input module and the macro module. A second test circuit is similarly formed with third and fourth multiplexers and a second control register. A test input signal of a plurality of bits is supplied to the first multiplexer, and a latched signal of the first control register is supplied to the third multiplexer, thereby allowing a latched signal of the second control register to be output as a test output signal for observation. Thus, testing techniques requiring a small additional circuit and a small number of additional wires for the test can be provided.

1 Claim, 5 Drawing Sheets

5,729,553

SEMICONDUCTOR INTEGRATED CIRCUIT WITH A TESTABLE BLOCK

This is a divisional of application Ser. No. 08/518,961, filed Aug. 24, 1995.

BACKGROUND OF THE INVENTION

The present invention relates to testing techniques for semiconductor integrated circuits, in particular, for large-scale integrated circuits (LSIs).

Various techniques of a scan testing and a direct-access testing for LSIs are described in "Designer's Guide to Testable ASIC Devices" by W. M. Needham (Ch. 5, pp. 87–124, Van Nostrand Reinhold, New York, 1991). The testing techniques for LSIs are desired to meet various requirements as follows: All the blocks and signal paths included therein can be tested in a short period of time; an additional circuit for the test is small; the number of additional wires for the test is small; and the operation speed of the tested circuit is not largely decreased in the normal mode.

It is herein assumed that one block contained in an LSI includes a combinational logic circuit and a plurality of flip-flops. The plural flip-flops are embedded on signal paths in the combinational logic circuit, so as to latch corresponding signals in the combinational logic circuit during the normal mode operation of the LSI. In a scan mode of the scan testing technique, these flip-flops are cascaded to one another so as to form a scan chain (shift register). An input signal for the scan testing, which is supplied from the outside of the LSI bit by bit in a serial manner in the scan mode, is latched by the shift register, and the latched signal is then supplied to the combinational logic circuit. Each flip-flop can fetch the test result of the combinational logic circuit in the normal mode. The test result thus fetched by the flip-flops is output bit by bit in a serial manner from the shift register to be observed in the external of the LSI.

When one LSI includes a plurality of blocks, it is desirable that each block can be tested independently from one another for performing the test efficiently. According to the scan testing technique, a plurality of flip-flops are additionally provided the periphery (on the sides of the input port and the output port) of each of the plural blocks, and all the flip-flops are wired to one another so as to form one scan chain. According to the direct-access testing technique, a plurality of multiplexers are additionally provided and wired to one another so that a test input can be directly set in each block from the outside and that the test result of each block can be directly observed on the outside.

According to the scan testing technique utilizing a plurality of flip-flops embedded on signal paths in a combinational logic circuit, in the case where the block to be tested includes two types of flip-flops, one of which is a positive edge triggered type that is operated synchronously with the rising edge of a clock signal and the other of which is a negative edge triggered type that is operated synchronously with the falling edge of a clock signal, there arises a problem that there is a possibility that a test signal cannot be correctly scanned in. Japanese Laid-Open Patent Publication No. 2-218974 discloses a technique for overcoming this problem, in which a scan chain is formed so that all the negative edge triggered flip-flops are followed by all the positive edge triggered flip-flops. This technique, however, leads to another problem that the constructing freedom of a scan chain is largely degraded.

The scan testing technique used for an LSI including a plurality of blocks in which a scan chain is additionally provided in the periphery of all the blocks is advantageous in the small number of additional wires for the test. However, since setting of a test input and the observation of a test result can be performed bit by bit, a long period of time is required for the test. Furthermore, this technique has other problems that an additional circuit for the test is large and that the operation speed in the normal mode is largely decreased.

The direct-access testing technique for an LSI including a plurality of blocks is advantageous in that the time required for the test can be shorten because setting of a test input and the observation of a test result can be performed with regard to a plurality of bits at a stroke. However, this technique has a problem that a large number of wires are additionally provided for the test.

SUMMARY OF THE INVENTION

The object of the present invention is providing testing techniques for a semiconductor integrated circuit requiring a small additional circuit and a small number of additional wires for the test.

Each of first and second semiconductor integrated circuits of the invention comprises a first, a second and a third blocks that are cascaded to one another and a test unit for testing the first, second and third blocks.

The test unit of the first semiconductor integrated circuit comprises a first multiplexer between the second block and the third block, a second multiplexer between the first block and the second block, a first control register between the second multiplexer and the second block, a third multiplexer between the second block and the third block, a fourth multiplexer between the first block and the second block, and a second control register between the fourth multiplexer and the second block. The first multiplexer selects either a test input signal supplied from the outside of the first semiconductor integrated circuit or a part of an output signal of the second block, and supplies the selected signal to the third block. The second multiplexer selects either the signal selected by the first multiplexer or a part of an output signal of the first block. The first control register latches the signal selected by the second multiplexer synchronously with a clock signal, and supplies the latched signal to the second block. The third multiplexer selects either the signal latched by the first control register or another part of the output signal of the second block, and supplied the selected signal to the third block. The fourth multiplexer selects either the signal selected by the third multiplexer or another part of the output signal of the first block. The second control register latches the signal selected by the fourth multiplexer synchronously with the clock signal, and supplied the latched signal to the second block.

When the first semiconductor integrated circuit is operated in the normal mode, the first and third multiplexers select the output signal of the second block and the second and fourth multiplexers select the output signal of the first block. When this semiconductor integrated circuit is operated in a first test mode, the first and third multiplexers select the other signals than the output signal of the second block and the second and fourth multiplexers select the other output signals than the output signal of the first block, so that the first control register and the second control register are cascaded to each other. In a second test mode, the first and third multiplexers select the output signal of the second block and the second and fourth multiplexers select the other signals than the output signal of the first block, so that the output signal of the second block is latched by the first and second control registers. Through the combination of the normal mode, the first test mode and the second test mode, setting of a test input in each block and observation of the test result of each block can be performed in a short period of time by using a plurality of bits as a unit. For example, a test input for the second block is divided into a first partial input and a second partial input each of a plurality of bits, and the respective partial inputs are set in the second block in two clock cycles in the first test mode.

In the second semiconductor integrated circuit, a signal corresponding to an expected value of the test result of the first block is scanned in a shift register formed with a plurality of flip-flops in the third block. The third block is tested by the scan testing technique utilizing a plurality of flip-flops embedded on signal paths in a combinational logic circuit. Priorly to the test for the first block, the signal corresponding to the expected value of the test result of the first block is scanned in the shift register in the third block as an expected value input. The actual test result of the first block is compared with the expected value input that is scanned in as above, and the result of the comparison is compressed to one bit to be observed in the external of the second semiconductor integrated circuit. The second block is tested by the direct-access testing technique.

In a third semiconductor integrated circuit of the invention, one block includes both positive edge triggered flip-flops and negative edge triggered flip-flops and all the flip-flops forming a scan chain (shift register) are operated as a single triggered type of flip-flops in the test mode.

DETAILED DESCRIPTION OF THE INVENTION

The present invention will now be described with regard to four embodiments referring to the accompanying drawings.

An LSI according to the first embodiment includes a first, a second and a third blocks to be tested that are cascaded to one another. An LSI according to the second embodiment also includes similar three blocks. An LSI according to the third or fourth embodiment includes at least one block to be tested.

The second block included in the LSI of the first embodiment is a circuit block designated as a "macro module". The macro module indicates a functional block such as an arithmetic and logic unit, a multiplier, a ROM (read only memory), a RAM (random access memory) and the like. The second block can be another kind of a circuit block constructed with logic gates or flip-flops. The first block is a circuit block for receiving a signal supplied from external pins of the LSI, processing the receive signal and supplying the processed signal to the macro module, and is referred to as the "input module" for convenience in the following description. The third block is a circuit block for receiving an output signal of the macro module, processing the received signal and outputting the processed signal to external pins of the LSI, and is referred to as the "output module" for convenience in the following description.

FIRST EMBODIMENT

Figure 1:
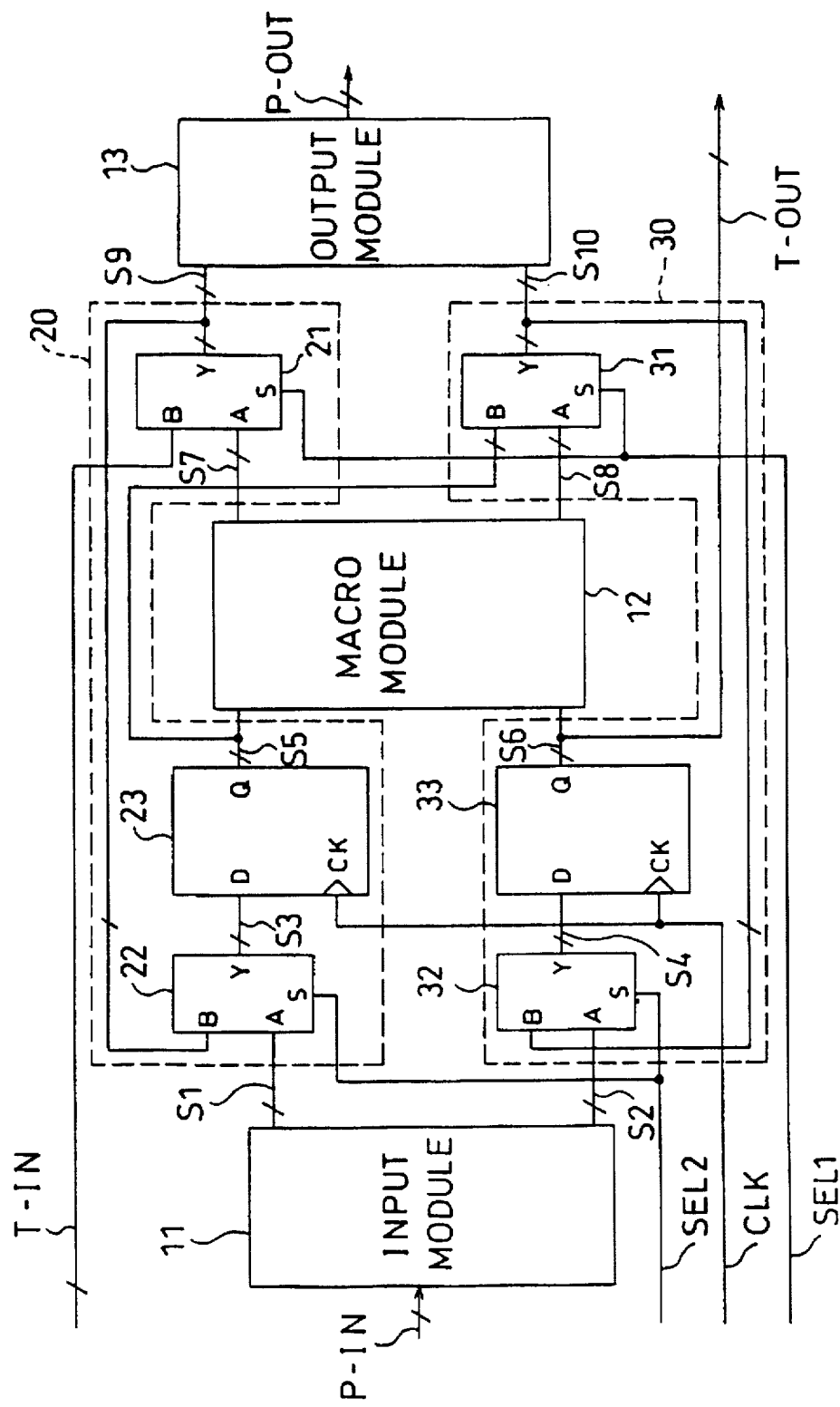
FIG. 1 is a circuit diagram of the configuration of a semiconductor integrated circuit according to a first embodiment of the invention.

FIG. 1 shows a configuration of the LSI according to the invention. The LSI of FIG. 1 comprises an input module 11, a macro module 12, an output module 13, a first test circuit 20, and a second test circuit 30. The input module 11 receives a parallel input signal P-IN of 64 bits supplied from external pins of the LSI, processes the received signal and supplies the processed signal of 64 bits to the macro module 12. The macro module 12 receives the signal of 64 bits supplied from the input module 12, processes the received signal, and supplies the processed signal of 64 bits to the output module 13. The output module 13 receives the signal of 64 bits supplied form the macro module 12, processes the received signal to obtain a parallel output signal P-OUT of 64 bits and supplies the output signal P-OUT to external pins of the LSI. The first and second test circuits 20 and 30 form a test unit for independently testing the input module 11, the macro module 12 and the output module 13.

The first test circuit 20 includes a first multiplexer 21, a second multiplexer 22 and a first control register 23. The first multiplexer 21 selects, as a signal S9, either a test input signal T-IN of 32 bits supplied from external pins of the LSI or a partial output signal S7 of 32 bits which is a half portion of an output signal of the macro module 12, and supplies the selected signal S9 to the output module 13. The second multiplexer 22 selects, as a signal S3, either the signal S9 selected by the first multiplexer 21 or a partial output signal S1 of 32 bits which is a half portion of an output signal of the input module 11. The first control register 23 includes thirty two D flip-flops so as to latch the signal S3 selected by the second multiplexer 22 synchronously with a clock signal CLK supplied from an external pin of the LSI and supply a latched signal S5 to the macro module 12.

The second test circuit 30 includes a third multiplexer 31, a fourth multiplexer 32 and a second control register 33. The third multiplexer 31 selects, as a signal S10, either the signal S5 latched by the first control register 23 or a partial output signal S8 of 32 bits which is another half portion of an output signal of the macro module 12, and supplies the selected signal S10 to the output module 13. The fourth multiplexer 32 selects, as a signal S4, either the signal S10 selected by the third multiplexer 31 or a partial output signal S2 of 32 bits which is another half portion of an output signal of the input module 11. The second control register 33 includes thirty two D flip-flops so as to latch the signal S4 selected by the fourth multiplexer 32 synchronously with the clock signal CLK and supply a latched signal S6 to the macro module 12. The signal S6 latched by the second control register 33 is supplied to external pins of the LSI as a test output signal T-OUT of 32 bits.

As is shown in FIG. 1, a mode selecting signal SEL1 is supplied to the first and third multiplexers 21 and 31 from an external pin of the LSI. A mode selecting signal SEL2 is supplied to the second and fourth multiplexers 22 and 32 from another external pin of the LSI.

In the normal mode, the partial output signal S1 of 32 bits of the input module 11 is selected by the second multiplexer 22, the other partial output signal S2 of 32 bits of the input module 11 is selected by the fourth multiplexer 32, the partial output signal S7 of 32 bits of the macro module 12 is selected by the first multiplexer 21, and the other partial output signal S8 of 32 bits of the macro module 12 is selected by the third multiplexer 31. As a result, the output signals S1 and S2 together forming the complete output signal of 64 bits of the input module 11 are supplied to the macro module 12 via the first and second control registers 23 and 33, and the output signals S7 and S8 together forming the complete output signal of 64 bits of the macro module 12 are supplied to the output module 13.

A test input of 64 bits for the macro module 12 is divided into a first partial input of 32 bits and a second partial input of 32 bits, which are set in the macro module 12 in two clock cycles. Specifically, the first partial input of 32 bits having been supplied from the external pins of the LSI as a test input signal T-IN is transferred through the first and second multiplexers 21 and 22, and stored in the first control register 23 in one clock cycle. Then, in the subsequent clock cycle, the first partial input is transferred through the third and fourth multiplexers 31 and 32, and stored in the second control register 33. Simultaneously, the second partial input of 32 bits having been supplied from the external pins of the LSI as a subsequent test input signal T-IN is transferred through the first and second multiplexers 21 and 22, and stored in the first control register 23. As a result, the test input of 64 bits composed of the first and second partial inputs is set in the macro module 12.

A test result of 64 bits of the macro module 12 is divided into a first partial result of 32 bits and a second partial result of 32 bits, which are observed in two clock cycles. Specifically, in one clock cycle, the first partial result is transferred through the first and second multiplexers 21 and 22, and stored in the first control register 23. Simultaneously, the second partial result is transferred through the third and fourth multiplexers 31 and 32, and stored in the second control register 33. At this point, the second partial result is observed through the external pins of the LSI based on the output of the second control register 33, i.e., a test output signal T-OUT. Then, in the subsequent clock cycle, the first partial result is transferred through the third and fourth multiplexers 31 and 32, stored in the second control register 33, and observed through the external pins of the LSI based on the output of the second control register 33.

In the input module 11, a parallel input signal P-IN of 64 bits is set as a test input directly from the external pins of the LSI. A test result of 64 bits of the input module 11 is divided into a first partial result of 32 bits and a second partial result of 32 bits, which are observed in two clock cycles. Specifically, in one clock cycle, the first partial result is transferred through the second multiplexer 22, and stored in the first control register 23. Simultaneously, the second partial result is transferred through the fourth multiplexer 32 and stored in the second control register 33. At this point, the second partial result is observed through the external pins of the LSI based on the output of the second control register 33, i.e., a test output signal T-OUT. In the subsequent clock cycle, the first partial result is transferred through the third and fourth multiplexers 31 and 32, stored in the second control register 33, and observed through the external pins of the LSI based on the output of the second control register 33.

A test input of 64 bits for the output module 13 is divided into a first partial input of 32 bits and a second partial input of 32 bits to be set in the output module 13. Specifically, the first partial input of 32 bits having been supplied from the external pins of the LSI as a test input signal T-IN is transferred through the first and second multiplexers 21 and 22, and stored in the first control register 23 in one clock cycle. The first partial input stored in the first control register 23 is supplied to the output module 13 through the third multiplexer 31. When the second partial input of 32 bits is supplied through the external pins of the LSI as a subsequent test input signal T-IN, the second partial input is transferred through the first multiplexer 21 to the output module 13. At this point, the first control register 23 remains to store the first partial input. In this manner, the test input of 64 bits composed of the first and second partial inputs is set in the output module 13. The test result of the output module 13 is directly observed through the external pins of the LSI based on a parallel output signal P-OUT of 64 bits.

In this manner, according to this embodiment, the test input can be set and the test result can be observed with regard to each of the input module 11, the macro module 12 and the output module 13 by using 32 bits or 64 bits as one unit. Therefore, test time can be largely decreased as compared with the conventional scan testing technique. Furthermore, since the sixty four D flip-flops interposed between the macro module 12 and the output module 13 in the conventional scan testing technique can be replaced with the two multiplexers 21 and 31 in this embodiment, the number of additional circuits for the test can be reduced, and the operation speed of the LSI in the normal mode can be suppressed from largely decreasing. In addition, while a test input signal of 64 bits is used in the conventional direct-access testing technique, the bit number of the test input signal can be halved in this embodiment, resulting in largely decreasing the number of additional wires for the test.

The configuration shown in FIG. 1 comprising the two test circuits 20 and 30 can be modified to include three or more test circuits. Furthermore, the bit number of the input signals and output signals of the input module 11, the macro module 12 and the output module 13 are not limited to 64 bits but can be optionally determined.

SECOND EMBODIMENT

Figure 2:
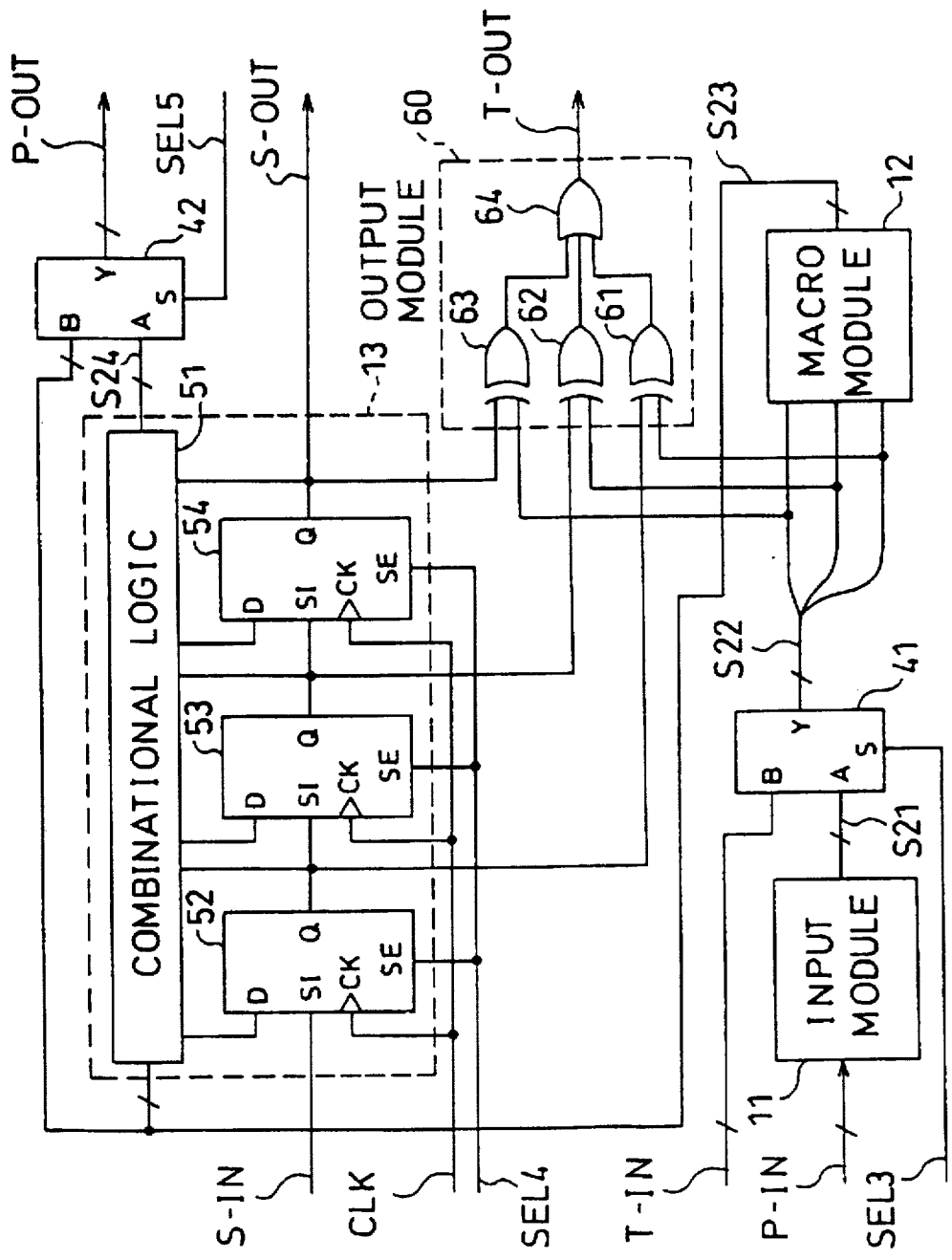
FIG. 2 is a circuit diagram of the configuration of a semiconductor integrated circuit according to a second embodiment of the invention.

FIG. 2 shows another configuration of an LSI according to the invention. The LSI of FIG. 2 comprises an input module 11, a macro module 12, an output module 13, a first multiplexer 41 and a second multiplexer 42. The input module 11 generates an output signal S21 of 3 bits from a parallel input signal P-IN supplied from external pins of the LSI. The first multiplexer 41 selects, as a signal S22, either a test input signal T-IN of 3 bits supplied from external pins of the LSI or the output signal S21 of 3 bits of the input module 11, and supplies the selected signal S22 to the macro module 12. The macro module 12 supplies a signal S23 of plural bits to the output module 13, and the output module 13 outputs a signal S24 of plural bits. The second multiplexer 42 selects either the output signal S23 of the macro module 12 or the output signal S24 of the output module 13, and supplies the selected signal to external pins of the LSI as a parallel output signal P-OUT. Mode selecting signals SEL3 and SEL5 are supplied from external pins of the LSI to the first multiplexer 41 and the second multiplexer 42, respectively.

The output module 13 includes a combinational logic circuit 51, and three scan flip-flops 52, 53 and 54 that are commonly supplied with a clock signal CLK and a mode selecting signal SEL4 from external pins of the LSI. The three scan flip-flops are embedded on signal paths in the combinational logic circuit 51, and latch corresponding signals in the combinational logic circuit 51 synchronously with the clock signal CLK in the normal mode. In the scan mode, the scan flip-flops 52, 53 and 54 are cascaded to one another so as to form a scan chain (shift register). A scan-in signal S-IN supplied bit by bit in a serial manner from an external pin of the LSI in the scan mode is latched by the shift register synchronously with the clock signal CLK, and the latched signal is then supplied to the combinational logic circuit 51. The three scan flip-flops 52, 53 and 54 can fetch the test result of the combinational logic circuit 51 in the normal mode. The test result fetched by these flip-flops is output by the shift register, as a scan-out signal S-OUT, bit by bit in a serial manner synchronously with the clock signal CLK in the scan mode, and the output result is observed through an external pin of the LSI.

Figure 3:
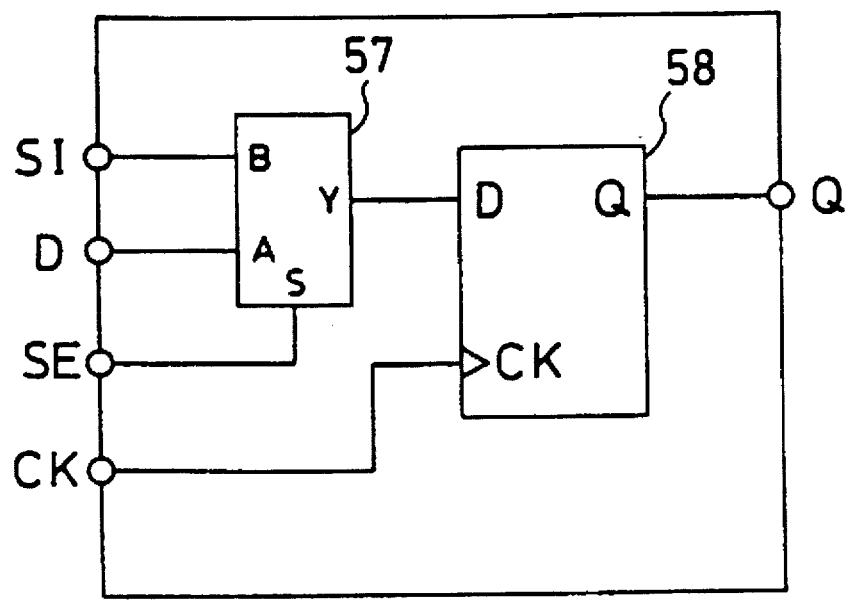
FIG. 3 is a circuit diagram of an exemplified internal configuration of a scan flip-flop shown in FIG. 2.

FIG. 3 shows the internal configuration of the scan flip-flop 52. The scan flip-flop 52 includes a multiplexer 57 having a port A of one bit and a port B of one bit, and a D flip-flop 58 for receiving the output of the multiplexer 57. The other scan flip-flops 53 and 54 have the same internal configuration as that shown in FIG. 3.

In the LSI of FIG. 2, a comparator 60 includes three exclusive-OR gates 61, 62 and 63 and one OR gate 64, so that the signal S22 of 3 bits selected by the first multiplexer 41 and a signal of 3 bits supplied from the three scan flip-flops 52, 53 and 54 in the output module 13 are compared with each other so as to supply a test output signal T-OUT of one bit to an external pin of the LSI. Thus, the first and second multiplexers 41 and 42, the shift register formed with the three scan flip-flops 52, 53 and 54 in the output module 13, and the comparator 60 together form a test unit for independently testing the input module 11, the macro module 12 and the output module 13.

In the normal mode, the output signal S21 of the output module 11 is selected by the first multiplexer 41, and the output signal S24 of the output module 13 is selected by the second multiplexer 42. The three scan flip-flops 52, 53 and 54 in the output module 13 latch the corresponding signals in the combinational logic circuit 51 synchronously with the clock signal CLK so as to serve as D flip-flops embedded on the signal paths in the combinational logic circuit 51.

The output module 13 is tested by a scan testing technique using the shift register including the three scan flip-flops 52, 53 and 54. The macro module 12 is tested by a direct-access testing technique using the first and second multiplexers 41 and 42.

The input module 11 is tested as follows: Priorly to the test of the input module 11, a data signal of 3 bits corresponding to an expected value of the test result of the input module 11 is set in the shift register including the three scan flips-flops 52, 53 and 54 in the output module 13 in three clock cycles. At this point, the data signal is supplied, as a scan-in signal S-IN, to the shift register bit by bit in a serial manner synchronously with the clock signal CLK. A parallel input signal P-IN is directly set in the input module 11 as a test input from the external pins of the LSI, and the test result of the input module 11 is supplied to the comparator 60 via the first multiplexer 41. The comparator 60 compares the test result of 3 bits of the input module 11 with the data signal of 3 bits supplied from the three scan flip-flops 52, 53 and 54, thereby outputting a test output signal T-OUT of one bit. The test output signal T-OUT is observed through the external pin of the LSI as a test result of the input module 11 compressed to be one bit. When the internal configuration of the input module 11 is known, it is possible to determine a test input pattern to be supplied to the input module 11 for the detection of an internal failure thereof and a data signal pattern corresponding to an expected value of the test result of the input module 11 by a known test generation algorithm. Examples of the test generation algorithm are described in "FAULT-TOLERANT COMPUTING: Theory and Techniques" edited by D. K. Pradhan. vol. 1, Ch. 1, pp. 1–94, Prentice-Hall, 1988.

In this manner, according to this embodiment, the test result of the input module 11 is compressed to be a test output signal T-OUT of one bit, and therefore, the number of additional wires for observing the test result can be reduced as compared with the conventional direct-access testing technique. Moreover, the three scan flip-flops 52, 53 and 54 built in the output module 11 are used for latching both a scan-in signal S-IN for testing the output module 13 and another scan-in signal S-IN corresponding to an expected value of the test result of the input module 11. As a result, the number of additional circuits for the test can be reduced. In the comparison with the conventional scan testing technique, flip-flops are required neither between the input module 11 and the macro module 12 nor between the macro module 12 and the output module 13 in this embodiment. Accordingly, this embodiment is advantageous because the test time can be shortened, the number of additional circuits for the test can be reduced, and the operation speed of the LSI in the normal mode can be suppressed from decreasing.

As modification of this embodiment, it is possible to omit the second multiplexer 42 and to provide a plurality of flip-flops between the macro module 12 and the output module 13 for observing the test result of the macro module 12 in the scan mode. Furthermore, the bit number of the output signal of the input module 11, i.e., the input signal of the macro module 12, is not limited to three but can be optionally determined.

THIRD EMBODIMENT

Figure 4:
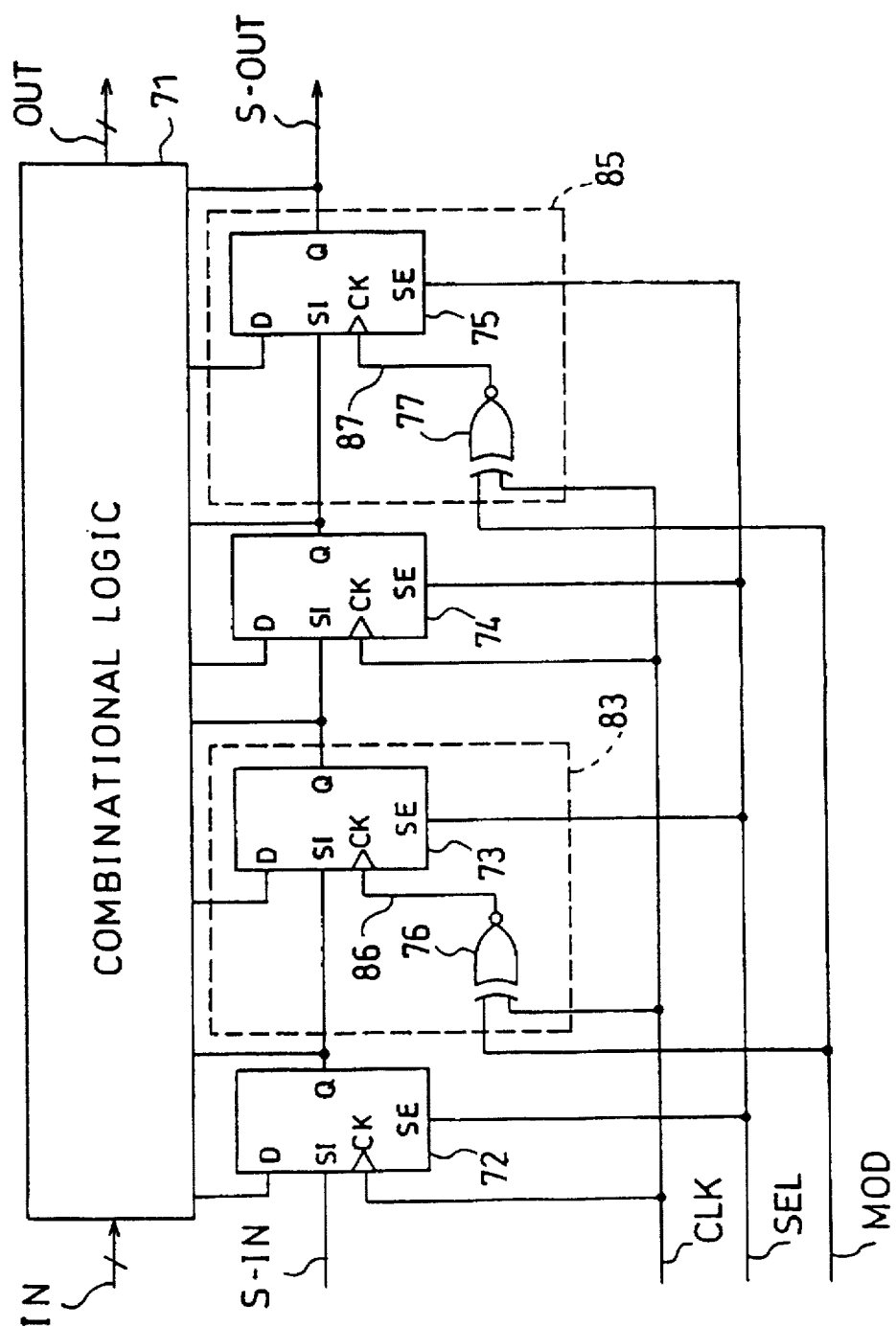
FIG. 4 is a circuit diagram of the configuration of a semiconductor integrated circuit according to a third embodiment of the invention.

FIG. 4 shows a configuration of one block contained in an LSI according to the invention. The block shown in FIG. 4 includes a combinational logic circuit 71, four positive edge triggered scan flip-flops 72, 73, 74 and 75, and two exclusive NOR gates 76 and 77. The combinational logic circuit 71 receives an input signal IN from a previous block, processes the received signal, and supplies the resultant signal as an output signal OUT to a subsequent block. The four scan flip-flops 72, 73, 74 and 75 are embedded on signal paths in the combinational logic circuit 71, and latch corresponding signals in the combinational logic circuit 71 in the normal mode. The internal configuration of each of the four scan flip-flops 72, 73, 74 and 75 is identical to that shown in FIG. 3. From external pins of the LSI are supplied a mode setting signal MOD for switching the operation mode of the LSI between the normal mode and the test mode, a mode selecting signal SEL for switching the mode between the normal mode and the scan mode, and a clock signal CLK. The mode setting signal MOD is supplied to one of the input terminals of each of the two exclusive NOR gates 76 and 77. The mode selecting signal SEL is used to select one of the ports of each of the four scan flip-flops 72, 73, 74 and 75. The clock signal CLK is supplied to the clock input terminal of each of the scan flip-flops 72 and 74 and also to the other input terminal of each of the exclusive NOR gates 76 and 77. The output of the exclusive NOR gate 76 is supplied to the clock input terminal of the scan flip-flop 73 via a path 86, and the output of the exclusive NOR gate 77 is supplied to the clock input terminal of the scan flip-flop 75 via a path 87.

In the normal mode, both the mode setting signal MOD and the mode selecting signal SEL are set at a low level. In this case, the two exclusive NOR gates 76 and 77 supply an inverted signal of the clock signal CLK to the scan flip-flops 73 and 75, respectively. Therefore, the scan flip-flops 72 and 74 are operated synchronously with the rising edge of the clock signal CLK, and the remaining scan flip-flops 73 and 75 are operated synchronously with the falling edge of the clock signal CLK, so as to respectively latch the corresponding signals in the combinational logic circuit 71.

In the test mode, the mode setting signal MOD is set at a high level. In this case, the two exclusive NOR gates 76 and 77 supply the clock signal CLK as it is to the scan flip-flops 73 and 75, respectively. Therefore, all the four scan flip-flops 72, 73, 74 and 75 are operated synchronously with the rising edge of the clock signal CLK.

Specifically, the LSI is operated in the test mode as follows: The mode selecting signal SEL is set at a high level, thereby selecting the scan mode for the four scan flip-flops 72, 73, 74 and 75 and cascading these flip-flops so as to form one scan chain (shift register). A scan-in signal S-IN supplied from the external pin of the LSI bit by bit in a serial manner in the scan mode is correctly latched by the shift register synchronously with the rising edge of the clock signal CLK, and the latched signal is supplied to the combinational logic circuit 71. Then, the mode selecting signal SEL is set at a low level, thereby selecting the normal mode for the four scan flip-flops 72, 73, 74 and 75. As a result, these flip-flops fetch the test result of the combinational logic circuit 71. The test result fetched by these flip-flops in this manner is output from the shift register as a scan-out signal S-OUT bit by bit in a serial manner synchronously with the rising edge of the clock signal CLK in the scan mode to be observed through the external pin of the LSI.

As is apparent from the above description, the exclusive NOR gate 76 and the scan flip-flop 73 together form one variable edge triggered flip-flop 83, and the exclusive NOR gate 77 and the scan flip-flop 75 together form another variable edge triggered flip-flop 85. These variable edge triggered flip-flops 83 and 85 work as negative edge triggered scan flip-flops when the mode setting signal MOD is at a low level, and as positive edge triggered scan flip-flops when the mode setting signal MOD is at a high level.

In this manner, according to this embodiment, the positive edge triggered flip-flops 72 and 74 and the negative edge triggered flip-flops 83 and 85 are both operated in the normal mode, while, in the test mode, all the four flip-flops 72, 83, 74 and 85 together forming one scan chain are operated as the positive edge triggered flip-flops. Therefore, while retaining high freedom in interconnecting order of the flip-flops in the scan chain, a test signal can be correctly scanned in.

In the variable edge triggered flip-flop 83, the layout of the exclusive NOR gate 76 and the scan flip-flop 73 on a silicon chip is determined so as to make the path 86 as short as possible. Since the clock path to the exclusive NOR gate 76 within the variable edge triggered flip-flop 83 is not branched but a single path, the timing design and the layout design of the clock path can be performed with ease. This also goes for the other variable edge triggered flip-flop 85. From the view point of the timing design, it is preferable that each of the flip-flops 83 and 85 is designed as one functional logic unit, that is, a hard macro, so that both the variable edge triggered flip-flops 83 and 85 have one and the same internal configuration.

In the case where a mode setting signal that is at a high level in the normal mode and is at a low level in the test mode is supplied from the external pin of the LSI, the exclusive NOR gates 76 and 77 are replaced with exclusive OR gates.

FOURTH EMBODIMENT

Figure 5:
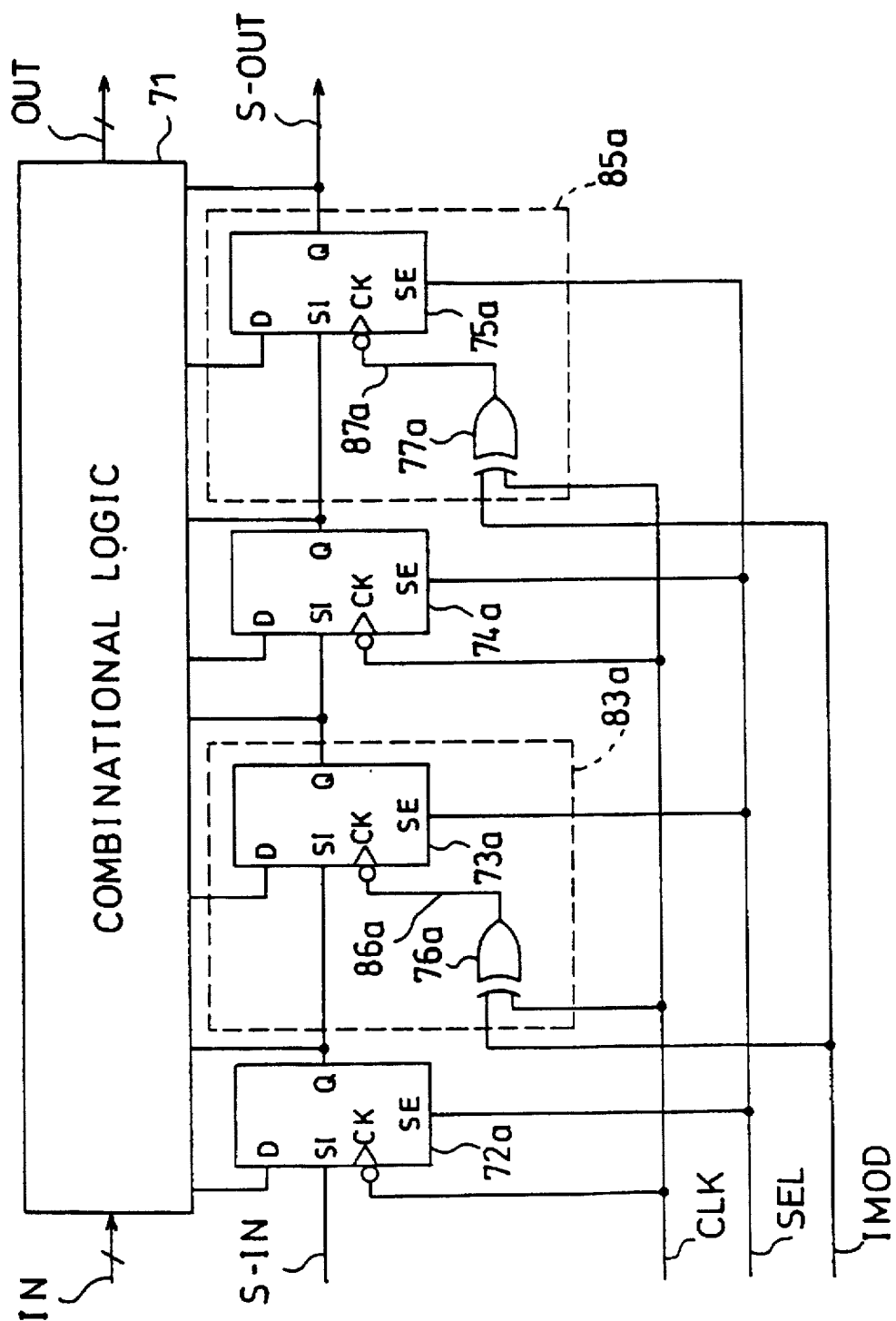
FIG. 5 is a circuit diagram of the configuration of a semiconductor integrated circuit according to a fourth embodiment of the invention.

FIG. 5 shows another configuration of one block contained in an LSI according to the invention. In the block shown in FIG. 5, the four positive edge triggered scan flip-flops 72, 73, 74 and 75 and the two exclusive NOR gates 76 and 77 of FIG. 4 are respectively replaced with four negative edge triggered scan flip-flops 72a, 73a, 74a and 75a and two exclusive OR gates 76a and 77a. Furthermore, in the block of FIG. 5, a mode setting signal IMOD is set at a high level in the normal mode and is set at a low level in the test mode. Since the block of FIG. 5 is similar to that of FIG. 4 except for the above, the detailed description of the configuration is herein omitted.

In the block of FIG. 5, the exclusive OR gate 76a and the scan flip-flop 73a together form one variable edge triggered flip-flop 83a, and the exclusive OR gate 77a and the scan flip-flop 75a together form another variable edge triggered flip-flop 85a. When the mode setting signal IMOD is at a high level, the variable edge triggered flip-flops 83a and 85a are operated as positive edge triggered scan flip-flops since the exclusive OR gates 76a and 77a invert the clock signal CLK. The variable edge triggered flip-flops 83a and 85a are operated as negative edge triggered scan flip-flops when the mode setting signal IMOD is at a low level because the two exclusive OR gates 76a and 77a allow the clock signal CLK to pass therethrough as it is. In the variable edge triggered flip-flops 83a and 85a, the layout of the exclusive OR gates 76a and 77a and the scan flip-flops 73a and 75a on a silicon chip are respectively determined so as to make a path 86a from the exclusive OR gate 76a to the scan flip-flop 73a and a path 87a from the exclusive OR gate 77a to the scan flip-flop 75a as short as possible.

In this embodiment, the negative edge triggered flip-flops 72a and 74a and the positive edge triggered flip-flops 83a and 85a are both operated in the normal mode, while, in the test mode, all of the four flip-flops 72a, 83a, 74a and 85a together forming one scan chain are operated as the negative edge triggered flip-flops. Therefore, while retaining high freedom in interconnecting order of the flip-flops in the scan chain, a test signal can be correctly scanned in.

In the case where a mode setting signal that is set at a low level in the normal mode and is set at a high level in the test mode is supplied from the external pin of the LSI, the two exclusive OR gates 76a and 77a are replaced with exclusive NOR gates.

What is claimed is:

1. A semiconductor integrated circuit comprising a first block, a second block and a third block that are cascaded to one another and a test unit for testing the first, second and third blocks, wherein the test unit includes:
a first multiplexer for selecting one of a test input signal supplied from an outside of the semiconductor integrated circuit and a part of an output signal of the second block, and supplying the selected signal to the third block;
a second multiplexer for selecting one of the signal selected by the first multiplexer and a part of an output signal of the first block;
a first control register for latching the signal selected by the second multiplexer synchronously with a clock signal and supplying the latched signal to the second block;

a third multiplexer for selecting one of the signal latched by the first control register and another part of the output signal of the second block, and supplying the selected signal to the third block;

a fourth multiplexer for selecting one of the signal selected by the third multiplexer and another part of the output signal of the first block; and a second control register for latching the signal selected by the fourth multiplexer synchronously with the clock signal and supplying the latched signal to the second block.

* * * * *